US008035203B2

(12) United States Patent
Torkington et al.

(10) Patent No.: US 8,035,203 B2
(45) Date of Patent: *Oct. 11, 2011

(54) RADIO FREQUENCY OVER-MOLDED LEADFRAME PACKAGE

(75) Inventors: Richard S. Torkington, Mesa, AZ (US); Michael R. Lyons, Gilbert, AZ (US); Kenneth V. Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 136 days.

This patent is subject to a terminal disclaimer.

(21) Appl. No.: 12/367,932

(22) Filed: Feb. 9, 2009

(65) Prior Publication Data

US 2009/0174042 A1    Jul. 9, 2009

Related U.S. Application Data

(63) Continuation of application No. 11/161,420, filed on Aug. 2, 2005, now Pat. No. 7,489,022.

(51) Int. Cl.
*H01L 23/495* (2006.01)
*H01L 21/66* (2006.01)

(52) U.S. Cl. .......................................... 257/666; 438/15

(58) Field of Classification Search .......... 257/666–677, 257/E23.031–E23.059, E23.004, E23.043–E23.05, 257/E23.41, E23.005–E23.009, E23.124, 257/698, E21.512, 778, 723, E25.011, E23.092, 257/700, 784, E23.125, 692, E23.174, E23.065; 438/15

See application file for complete search history.

(56) References Cited

U.S. PATENT DOCUMENTS

| 5,663,597 | A | 9/1997 | Nelson et al. |
| 7,180,161 | B2 | 2/2007 | Chiang et al. |
| 7,489,022 | B2* | 2/2009 | Torkington et al. ........... 257/666 |
| 2002/0014690 | A1* | 2/2002 | Ferling ........................ 257/690 |
| 2002/0027297 | A1 | 3/2002 | Ikenaga et al. |
| 2004/0173881 | A1 | 9/2004 | Harnden et al. |
| 2004/0256707 | A1 | 12/2004 | Sugimori |

(Continued)

FOREIGN PATENT DOCUMENTS
WO    WO2004025695    3/2004

OTHER PUBLICATIONS

Agar, Jr., Bill T., Deborah S. Bowser, Kenneth V. Buer and David W. Corman. "A Novel High Frequency Bond Wire Interface." Technical Developments, vol. 21, Feb. 1994, pp. 102-103.

(Continued)

*Primary Examiner* — Dao Nguyen
*Assistant Examiner* — Tram H Nguyen
(74) *Attorney, Agent, or Firm* — Snell & Wilmer L.L.P.

(57) ABSTRACT

An over-molded leadframe (e.g., a Quad Flat No-lead (QFN)) package capable of operating at frequencies in the range of about five gigahertz (GHz) to about 300 GHz and a method of making the over-molded leadframe package are disclosed. The over-molded leadframe package includes a capacitance lead configured to substantially reduce and/or offset the inductance created by one or more wirebonds used to connect an integrated circuit (IC) chip on the package to an input/output (I/O) lead. The IC chip is connected to the capacitance lead via one or more wirebonds, and the capacitance lead is then connected to the I/O lead via at least a second wirebond. Thus, inductance created by the one or more wirebonds on the package is substantially reduced and/or offset by the capacitance lead prior to a signal being output by the package and/or received by the IC chip.

24 Claims, 9 Drawing Sheets

U.S. PATENT DOCUMENTS

| | | |
|---|---|---|
| 2005/0045986 A1 | 3/2005 | Koo et al. |
| 2005/0121752 A1* | 6/2005 | Lee .............................. 257/666 |
| 2005/0248006 A1 | 11/2005 | Corisis |
| 2005/0260787 A1 | 11/2005 | Punzalan et al. |
| 2006/0186532 A1* | 8/2006 | Bromberger .................. 257/700 |

OTHER PUBLICATIONS

International Search Report dated Sep. 1, 2006.
EPO; Written Opinion for International Application No. PCT/US2006/016355 dated Sep. 1, 2006.
USPTO; Restriction Requirement for U.S. Appl. No. 11/161,420 dated Dec. 22, 2006.
USPTO; Office Action for U.S. Appl. No. 11/161,420 dated Feb. 7, 2007.
USPTO; Office Action for U.S. Appl. No. 11/161,420 dated Aug. 10, 2007.
EPO; International Preliminary Report on Patentability for International Application No. PCT/US2006/016355 dated Feb. 7, 2007.
USPTO; Office Action for U.S. Appl. No. 11/161,420 dated Feb. 25, 2008.
USPTO; Notice of Allowance for U.S. Appl. No. 11/161,420 dated Oct. 7, 2008.
EPO; Examination Report for European Application No. 06 751 843.1-2203 dated Feb. 7, 2011.

* cited by examiner

RADIO FREQUENCY OVER-MOLDED LEADFRAME PACKAGE

CROSS REFERENCE TO RELATED APPLICATION

This application is a continuation of U.S. Ser. No. 11/161,420, filed on Aug. 2, 2008, and entitled "RADIO FREQUENCY OVER-MOLDED LEADFRAME PACKAGE," which is hereby incorporated by reference.

FIELD OF THE INVENTION

The present invention generally relates to millimeter-wave packaging, and more particularly, to quad flat no-lead (QFN) packages.

BACKGROUND OF THE INVENTION

Currently, low cost component packaging includes the use of ceramic bolt-down packages, soft substrate bolt-down packages, Printed Circuit Board-based (PCB-based) packages, and over-molded leadframe packages. Over-molded leadframe packages, and particularly quad flat no-lead (QFN) packages, are the least expensive of these package types. The over-molded leadframe package class is known by several terms including, but not limited to, Small Outline Plastic Packages (SOIC), Quarter Size Outline Packages (QSOP), Thin Shrink Small Outline Plastic Packages (TSSOP), Mini Small Outline Plastic Packages (MSOP), Dual Flat No-Lead Plastic Package (DFN), Quad Flat No-Lead Plastic Package (QFN), Small Outline Transistor Plastic Package (SOT), Small Outline Transistor Plastic Packages (SC70-6), Shrink Small Outline Plastic Packages (SSOP), Dual-In-Line Plastic Packages (PDIP), Shrink Dual-In-Line Plastic Packages (SPDIP), Micro Lead Frame Plastic Package (MLFP), Power Small Outline Plastic Packages (PSOP), Plastic Leaded Chip Carrier Packages (PLCC), Metric Plastic Quad Flatpack Packages (MQFP), Thin Plastic Quad Flatpack Packages (TQFP), Thin Plastic Power Quad Flatpack Packages (PQ-LQFP), Single-In-Line Plastic Packages (SIP), and Ball Grid Array Packages (BGA). These over-molded leadframe packages suffer from significant performance degradation in electrical properties at high frequencies, which limits the use of these packages to frequencies below about 15 GHz. These performance degradations include the losses and impedance mismatches caused by the integrated circuit chip/wirebond/printed circuit board interface.

Typical wirebonding out of a QFN package is generally controlled with a single or double wirebond. The wirebond(s) acts as an inductor, or similar circuit, and it is the inductance created by the wirebond that degrades the performance of a typical QFN package. Therefore, a QFN package that reduces or offsets the inductance created by one or more wirebonds is needed.

SUMMARY OF THE INVENTION

In one exemplary embodiment, an overmolded leadframe package comprises: a leadframe; an overmold material surrounding portions of the leadframe and forming a bottom surface of the overmolded leadframe package, wherein the bottom surface is configured to be connected to a printed circuit board (PCB); an integrated circuit electrically connected to the leadframe and contained within the overmolded leadframe package; and a capacitance lead in the overmolded leadframe package, wherein the capacitance lead is located in the overmolded leadframe package so that it can not contact the PCB, and wherein the capacitance lead is configured to form a first portion of a capacitor in response to alignment with a corresponding capacitance lead on the PCB.

In another exemplary embodiment, an overmolded leadframe package comprises: a capacitance lead configured to form a part of a capacitor in the overmolded leadframe package; and at least one wirebond attached to the capacitance lead and attached to an integrated circuit, wherein the integrated circuit is located within the overmolded leadframe package; wherein the capacitance lead is configured to align with a corresponding capacitance lead in a printed circuit board (PCB) and is further configured to reduce or offset the inductance of the at least one wirebond.

In another exemplary embodiment, an overmolded leadframe package comprises: an input/output lead; and a capacitance lead wirebonded to the input/output lead; wherein the capacitance lead can not make a physical contact with anything outside of the overmolded leadframe package.

In another exemplary embodiment, an overmolded leadframe package comprising at least one raised lead, wherein the at least one raised lead is a first plate of a two plate capacitor that is formed only by mounting the overmolded leadframe package to a printed circuit board that comprises a second plate of the two plate capacitor.

In another exemplary embodiment, a method of making an electronic device that comprises a package that comprises an integrated circuit chip, a first lead, and a second lead, the method comprises: coupling a first wirebond to the integrated circuit chip and the first lead; coupling a second wirebond to the first lead and the second lead, wherein the first lead is a capacitance lead comprising one plate of a two plate capacitor, wherein the first lead is configured to not contact a printed circuit board (PCB), wherein the second lead is a radio frequency input/output lead having a surface that is flush with a surface of the package, wherein the second lead is configured to contact the PCB, wherein the PCB further comprises a metal region; and substantially aligning the metal region on the PCB with the first lead such that the metal region of the PCB forms the second plate of the two plate capacitor.

In another exemplary embodiment, an overmolded leadframe package comprises: a leadframe; an overmold material surrounding portions of the leadframe and forming a bottom surface of the overmolded leadframe package, wherein the bottom surface connects to a printed circuit board (PCB); an integrated circuit electrically connected to the leadframe and contained within the overmolded leadframe package; a capacitance lead in the overmolded leadframe package, wherein the capacitance lead is located in the overmolded leadframe package so that it can not contact the PCB, and wherein the capacitance lead forms a first portion of a capacitor in response to alignment with a corresponding capacitance lead on the PCB; and a dielectric space formed between the capacitance lead and the corresponding capacitance lead on the PCB.

BRIEF DESCRIPTION OF THE DRAWINGS

A more complete understanding of the present invention may be derived by referring to the detailed description and claims when considered in connection with the drawing Figures, where like reference numbers refer to similar elements throughout the Figures.

DETAILED DESCRIPTION OF THE INVENTION

The detailed description of exemplary embodiments of the invention herein makes reference to the accompanying figures, which show the exemplary embodiment by way of illustration and its best mode. While these exemplary embodiments are described in sufficient detail to enable those skilled in the art to practice the invention, it should be understood that other embodiments may be realized and that logical and mechanical changes may be made without departing from the spirit and scope of the invention. Thus, the detailed description herein is presented for purposes of illustration only and not of limitation. For example, the steps recited in any of the method or process descriptions may be executed in any order and are not limited to the order presented.

For the sake of brevity, functional embodiments of the apparatus and systems (and components of the individual operating components of the systems) may not be described in detail herein. Furthermore, the connecting lines shown in the various figures contained herein are intended to represent exemplary functional relationships and/or physical connections between the various elements. It should be noted that many alternative or additional functional relationships or physical connections may be present in a practical system.

Various embodiments of the invention include, but are not limited to, amplifiers (e.g., power amplifiers, low noise amplifiers, and the like), phase shifters, mixers, switches, and the like. In exemplary embodiments, these electronic devices are configured to reduce and/or offset the undesirable inductance created by the wirebond connection(s) that are generally used to transfer a signal from the integrated circuit chip to a circuit board. By reducing and/or offsetting the effect of the inductance created by the wirebond(s), the performance degradation experienced by current electronic devices is, likewise, reduced and/or substantially eliminated. Therefore, embodiments of the present invention, among other things, enable electronic devices typically used for low frequency applications to be modified and/or manufactured for high frequency applications (e.g., in the range of about five gigahertz (GHz) to about 300 GHz, preferably about 20 GHz to about 40 GHz). In other words, embodiments of the present invention increase the frequency of operation of typical QFN packages.

Figure 1:
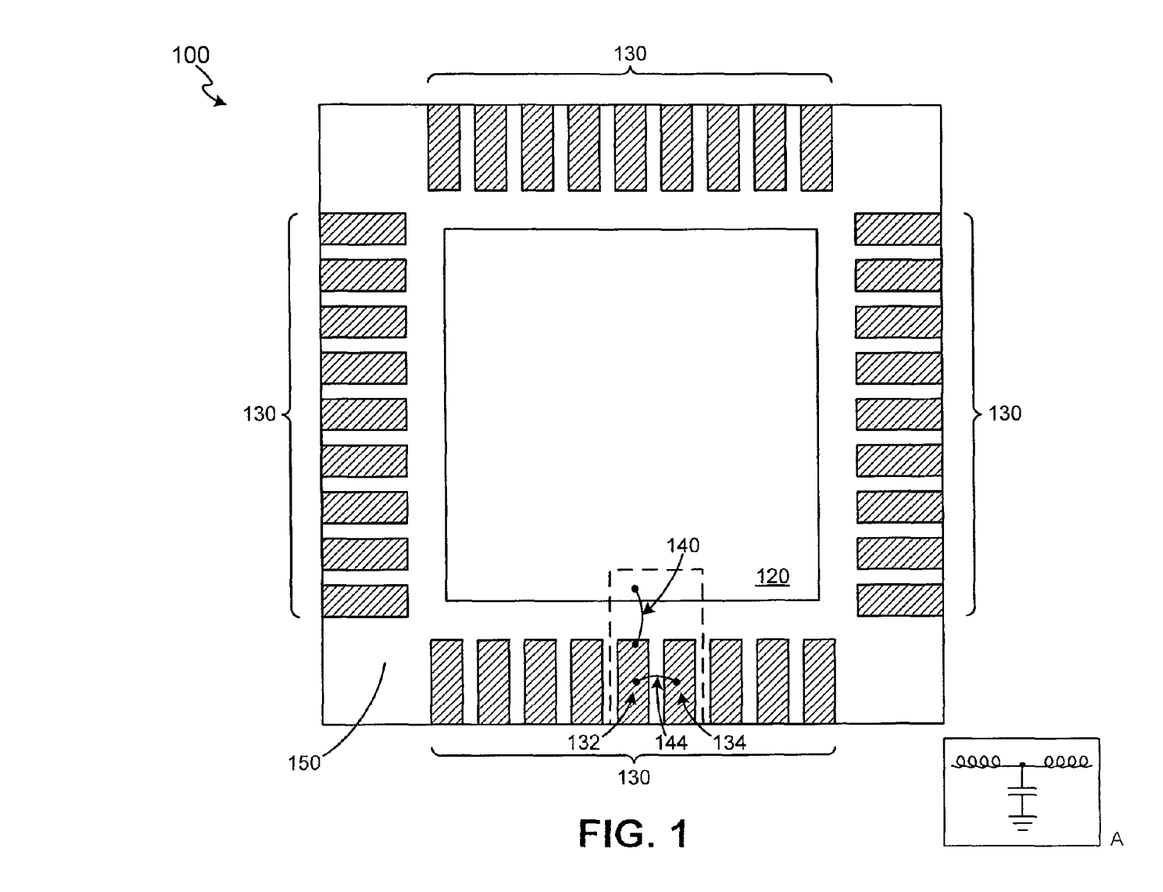
FIG. 1 is a schematic diagram of an exemplary embodiment of a high frequency quad flat no-lead (QFN) package.

Turning now to the figures, FIG. 1 is a schematic diagram of an exemplary embodiment of an over-molded leadframe package, namely, a QFN package 100 capable of operating at high frequencies. QFN package 100 includes a die bond-pad 110, which may be any die bond-pad known in the art or later developed.

In accordance with an exemplary embodiment, QFN package 100 also includes a monolithic microwave integrated circuit ("MMIC") chip 120 connected to die bond-pad 110. MMIC chip 120 may by any monolithic microwave integrated circuit chip known in the art or later developed. In one embodiment, MMIC chip 120 is a monolithic microwave integrated circuit chip operating in frequencies in the Ku frequency band. In another embodiment, MMIC chip 120 is a monolithic microwave integrated circuit chip operating in frequencies greater than the Ku frequency band. In yet another exemplary embodiment, MMIC chip 120 is a monolithic microwave integrated circuit chip operating in the frequency range of about five gigahertz (GHz) to about 300 GHz, and preferably in the frequency range of about 20 GHz to about 40 GHz. In addition, the invention may be used for applications under five GHz and/or applications greater than 300 GHz.

QFN package 100 may be any size QFN package known in the art or later developed. For example, QFN package 100 may be as small as a 2×2 (i.e., 2 mm×2 mm) QFN package, and as large as a 15×15 (i.e., 15 mm×15 mm) QFN package. In the exemplary embodiment illustrated in FIG. 1, QFN package 100 is a 6×6 (i.e., 6 mm×6 mm), 36-lead QFN package. Notably, the invention does contemplate that QFN package 100 may be a QFN package larger than 15 mm×15 mm and may include any number of leads.

Leads 130 may be formed of any suitable conductive material known in the art or later developed. For example, leads 130 may be formed of a metal, a metal alloy, and the like. In various exemplary embodiments, leads 130 are formed of copper and/or a copper alloy. In other embodiments, leads 130 are formed of gold and/or a gold alloy. In yet other embodiments, leads 130 are formed of aluminum and/or an aluminum alloy.

In accordance with one exemplary embodiment, QFN package 100 includes at least one capacitance lead 132 connected to MMIC chip 120 via a wirebond 140. Capacitance lead 132 may be suitably configured to reduce and/or offset the effect of inductance created by a wirebond 140 used to transfer signals to and/or from MMIC chip 120. In one exemplary embodiment, capacitance lead is suitably configured to form a portion of a capacitor. As such, a capacitor 775 may be one of at least two metallic plates (e.g., capacitance leads 132 and 770) with a space (i.e., air and/or a dielectric) in between the plates. Furthermore, capacitance lead 132 may include any material known in the art capable of forming a capacitor. In one exemplary embodiment, capacitance lead 132 is suitably configured to reduce and/or offset inductance in the range of about 0.1 nanohenries (nH) to about 1.0 nH, and preferably 0.5 nH. As such, capacitance lead 132 may be suitably configured (e.g., size, shape, material, and the like) to produce a pre-determined, suitable amount of capacitance to reduce and/or offset the inductance created by wirebond 140.

Wirebond 140 may be any device suitably configured to transfer a signal to and/or from MMIC 120. As such, wirebond 140 may be any wirebond known in the art or later developed. As such, wirebond 140 may be formed of any conductive material (e.g., copper, gold, aluminum, silver, and the like). In an aspect of various embodiments, QFN package 100 may include more than one wirebond 140 coupling MMIC 120 to capacitance lead 132.

In another exemplary embodiment, QFN package 100 includes an input/output (I/O) lead 134 coupled to capacitance lead 132 via a wirebond 144. I/O lead 134 may be any device suitably configured to transfer a signal to and/or from QFN package 100. Furthermore, I/O lead 134 may be any I/O lead known in the art or later developed. As such, I/O lead 134 may comprise any of the materials discussed above with respect to leads 130, and may be configured to include any suitable size, shape, height, width, depth, mass, volume, and the like.

Wirebond 144 may be any device suitably configured to transfer a signal to and/or from QFN package 100. As such, wirebond 144 may be any wirebond known in the art or later developed. As such, wirebond 144 may be formed of any conductive material (e.g., copper, gold, aluminum, silver, and the like). In an aspect of various embodiments, QFN package 100 may include more than one wirebond 144 coupling I/O lead 134 to capacitance lead 132.

As shown by the inset in FIG. 1, the configuration of wirebond 140 connected to capacitance lead 132, and capacitance lead 132 connected to wirebond 144 forms an inductor-capacitor-inductor topology (i.e., a three-pole low pass filter). As such, any undesirable inductance created by wirebond 140 and/or 144 may be reduced and/or offset by appropriately configuring capacitance lead 132. Similarly, any undesirable capacitance created by capacitance lead 132 may be reduced and/or offset by appropriately configuring wirebonds 140 and/or 144, preferably wirebond 144.

In accordance with one exemplary embodiment, QFN package 100 includes an over-mold material 150. Over-mold material 150 may be any suitable over-mold material known in the art or later developed. In one exemplary embodiment, over-mold material 150 is plastic.

Figure 2:
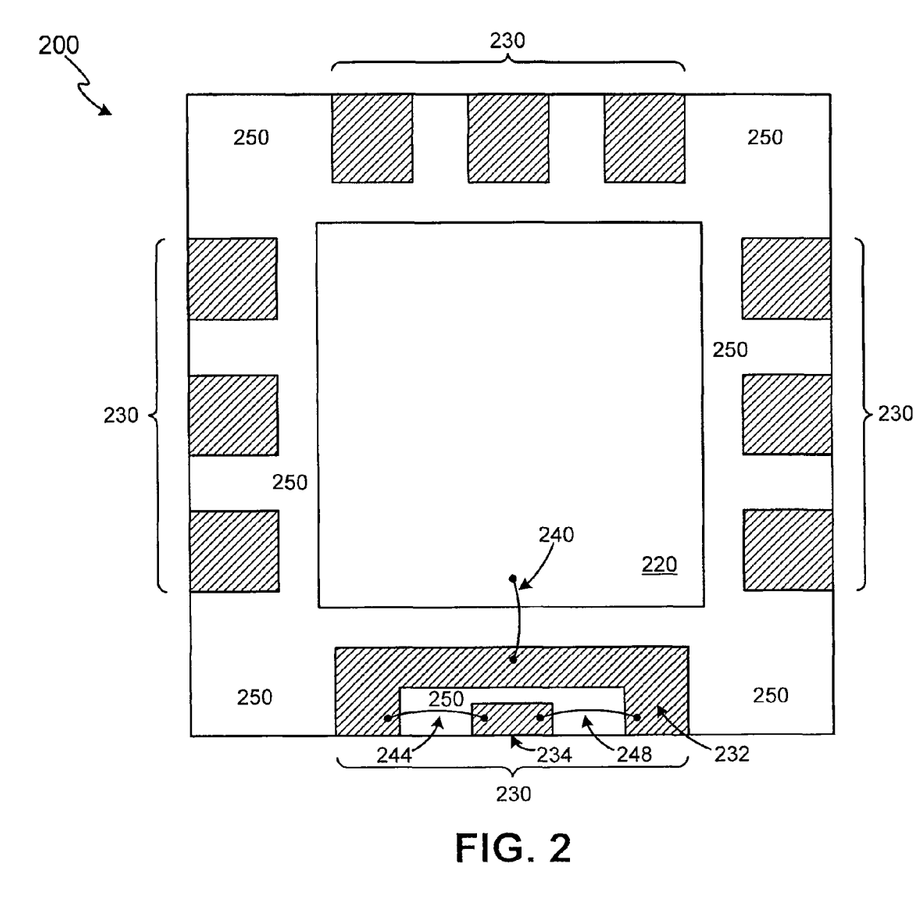
FIG. 2 is a schematic diagram of another exemplary embodiment of a high frequency QFN package.

FIG. 2 is a schematic diagram of another exemplary embodiment of a QFN package 200 capable of operating at high frequencies. In one embodiment, QFN package 200 is a QFN package similar to QFN package 100, discussed above. Furthermore, QFN package 200, in various embodiments, includes a MMIC chip 220, a plurality leads 230, and an over-mold material 250 similar to MMIC 120, leads 130, and over-mold material 150, discussed above respectively.

In various exemplary embodiments, QFN package 200 also includes a capacitance lead 232 connected to MMIC 220 via a wirebond 240 similar to capacitance lead 132 connected to MMIC 120 via wirebond 140, discussed above. Moreover, QFN package 200 includes an I/O lead 234 connected to capacitance lead 232 via a wirebond 244 similar to I/O lead 134 connected to capacitance lead 132 via a wirebond 144, discussed above.

Capacitance lead 232, in one exemplary embodiment, is configured to include any suitable size, shape, height, width, depth, mass, volume, thickness, material, and the like which may reduce and/or offset the effect of the inductance created by wirebond 240 and/or wirebonds 244, 248. In an aspect of one exemplary embodiment, capacitance lead 232 may be further connected to I/O lead 234 via at least one additional wirebond 248 similar to wirebonds 140, 144, 240, and 244, discussed above. Thus, in accordance with one exemplary embodiment of the invention, QFN package 200 includes another wirebond 248 connecting capacitance lead 232 to I/O lead 234.

Notably, QFN package 200, in various exemplary embodiments, includes any size QFN package known in the art or later developed. Similar to QFN package 100, QFN package 200 may be as small as a 2×2 (i.e., 2 mm×2 mm) QFN package, and as large as a 15×15 (i.e., 15 mm×15 mm) QFN package. In the exemplary embodiment illustrated in FIG. 2, QFN package 200 is a 4×4 (i.e., 4 mm×4 mm), 12-lead QFN package. In addition, the invention does contemplate that QFN package 200 may be a QFN package larger than 15 mm×15 mm and may include any number of leads.

Figure 3:
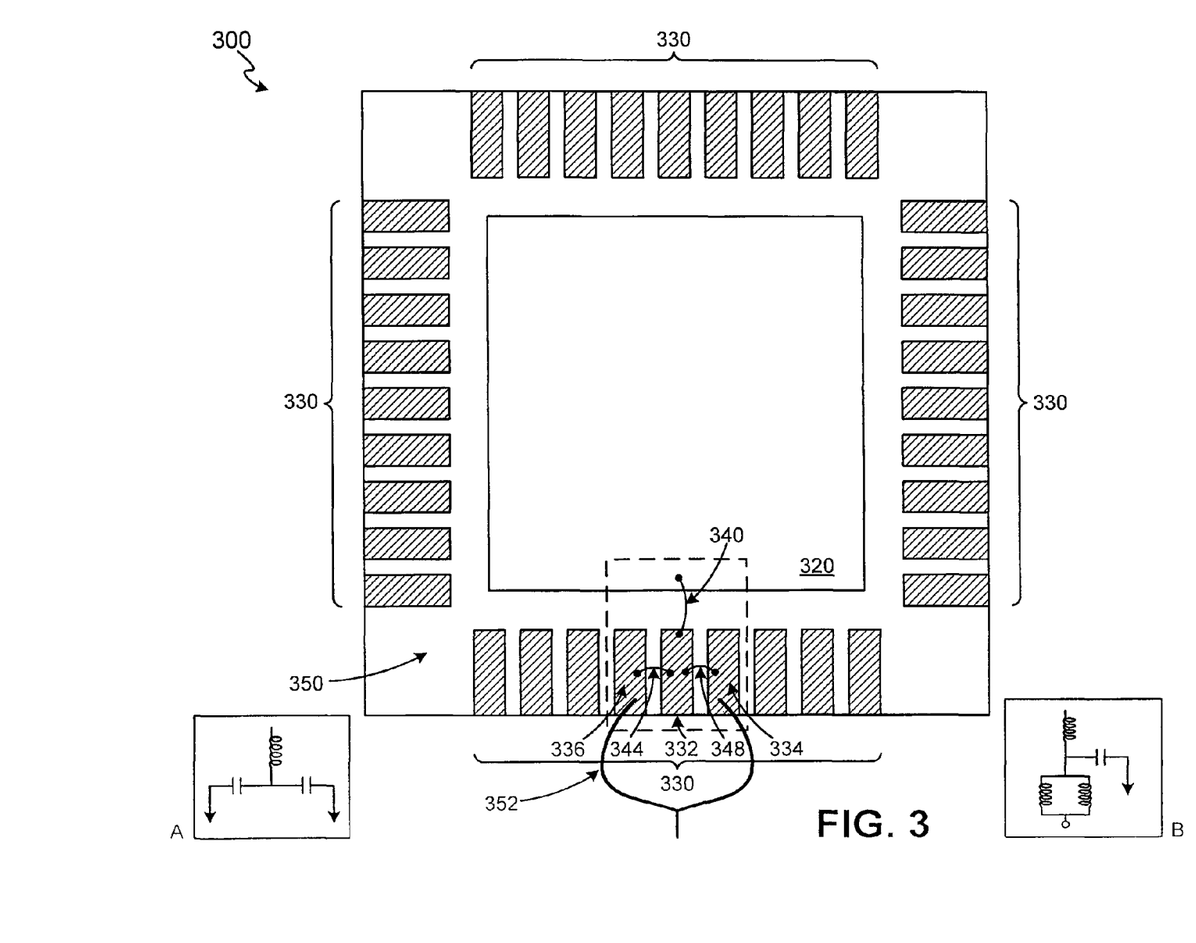
FIG. 3 is a schematic diagram of yet another exemplary embodiment of a high frequency QFN package.

FIG. 3 is a schematic diagram of yet another exemplary embodiment of a QFN package 300 capable of operating at high frequencies. In one embodiment, QFN package 300 is a QFN package similar to QFN package 100, discussed above. Furthermore, QFN package 300, in various embodiments, includes a MMIC chip 320, a plurality leads 330, and an over-mold material 350 similar to MMIC 120, leads 130, and over-mold material 150, discussed above respectively.

In various exemplary embodiments, QFN package 300 also includes a capacitance lead 332 connected to MMIC 320 via a wirebond 340 similar to capacitance lead 132 connected to MMIC 120 via wirebond 140, discussed above. Moreover, QFN package 300 includes an I/O lead 336 connected to capacitance lead 332 via a wirebond 344 similar to I/O lead 134 connected to capacitance lead 132 via a wirebond 144, discussed above respectively.

In accordance with one exemplary embodiment of the invention, QFN package 300 includes an I/O lead 334 similar to I/O leads 134 and 336, discussed above, connected to capacitance lead 332 via a wirebond 348 similar to wirebonds 140 and 144, discussed above. As set forth in inset A, the configuration of: wirebond 340 connected to capacitance lead 332, capacitance lead 332 connected to wirebond 344, and capacitance lead 332 connected to wirebond 348 forms a three-pole low pass filter (i.e., an L-C-L configuration) when I/O leads 334 and 336 are connected to one another via a wirebond 352 (wherein wirebond 352 is similar to wirebonds 140 and 144, discussed above). As set forth in inset B, the configuration of: wirebond 340 connected to capacitance lead 332, capacitance lead 332 connected to wirebond 344, and capacitance lead 332 connected to wirebond 348 forms a two-pole low pass filter (i.e., an L-C configuration) when I/O leads 334 and 336 are each independently coupled to an external device (not shown). As such, any undesirable inductance created by wirebond 340, 344, and/or 348 may be reduced and/or offset by appropriately configuring capacitance lead 332. Similarly, any undesirable capacitance created by capacitance lead 332 may be reduced and/or offset by appropriately configuring wirebonds 340, 344, and/or 348, preferably wirebond 344 and/or 348. Furthermore, QFN package 300 may include more than 3-poles (L-C-L) for applications utilizing higher bandwidths.

Notably, QFN package 300, in various exemplary embodiments, includes any size QFN package known in the art or later developed. Similar to QFN package 100, QFN package 300 may be as small as a 2×2 (i.e., 2 mm×2 mm) QFN package, and as large as a 15×15 (i.e., 15 mm×15 mm) QFN package. In the exemplary embodiment illustrated in FIG. 3, QFN package 200 is a 10×10 (i.e., 10 mm×10 mm), 28-lead QFN package. In addition, the invention does contemplate that QFN package 300 may be a QFN package larger than 15 mm×15 mm and may include any number of leads.

Figure 4:
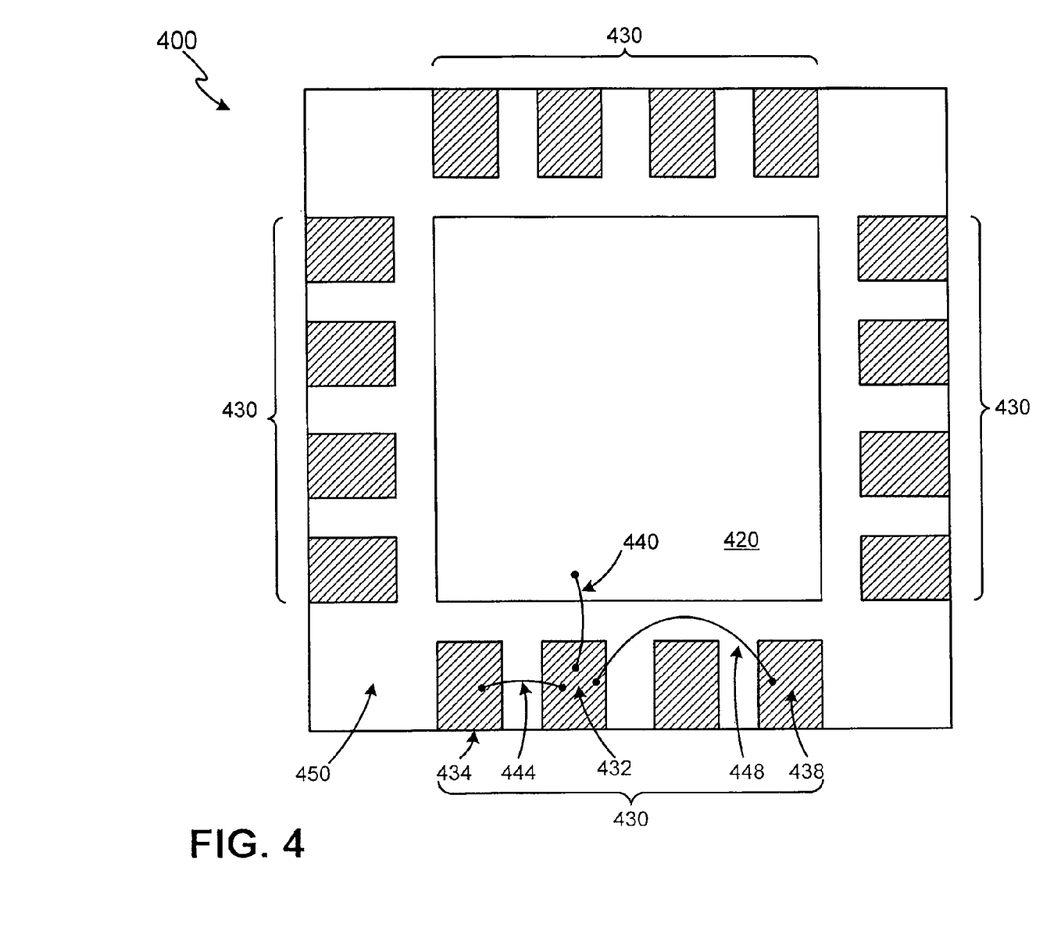
FIG. 4 is a schematic diagram of still another exemplary embodiment of a high frequency QFN package.

FIG. 4 is a schematic diagram of an exemplary embodiment of a QFN package 400 capable of operating at high frequencies. In one embodiment, QFN package 400 is a QFN package similar to QFN package 100, discussed above. Furthermore, QFN package 400, in various embodiments, includes a MMIC chip 420, a plurality leads 430, and an over-mold material 450 similar to MMIC 120, leads 130, and over-mold material 150, discussed above respectively.

In various exemplary embodiments, QFN package 400 also includes a capacitance lead 432 connected to MMIC 420 via a wirebond 440 similar to capacitance lead 132 connected to MMIC 120 via wirebond 140, discussed above. Moreover, QFN package 400 includes an I/O lead 434 connected to capacitance lead 432 via a wirebond 444 similar to I/O lead 134 connected to capacitance lead 132 via a wirebond 144, discussed above.

In accordance with one exemplary embodiment of the invention, QFN package 400 includes an I/O lead 438 similar to I/O lead 134, discussed above, connected to capacitance lead 432 via a wirebond 448 similar to wirebond 140, discussed above. Similar to QFN package 300, the configuration of wirebond 440 connected to capacitance lead 432, capacitance lead 432 connected to wirebond 444, and capacitance lead 432 connected to wirebond 448 forms a three-pole low pass filter (i.e., L-C-L). As such, any undesirable inductance created by wirebonds 440, 444, and/or 448 may be reduced and/or offset by appropriately configuring capacitance lead 432. Similarly, any undesirable capacitance created by capacitance lead 432 may be reduced and/or offset by appropriately configuring wirebonds 440, 444, and/or 448, preferably wirebond 444 and/or 448. Notably, the present discussion orients I/O lead 438 on the same side of QFN package 400 as capacitance lead 432, however, the invention contemplates that the various I/O leads and/or capacitance leads need not be on the same side of the package with each other and may be ordered in any suitable order on one or more sides.

QFN package 400, in various exemplary embodiments, includes any size QFN package known in the art or later developed. For example, similar to QFN package 100, QFN package 400 may be as small as a 2×2 (i.e., 2 mm×2 mm) QFN package, and as large as a 15×15 (i.e., 15 mm×15 mm) QFN package. In the exemplary embodiment illustrated in FIG. 4, QFN package 400 is a 5×5 (i.e., 5 mm×5 mm), 16-lead QFN package. In addition, the invention does contemplate that QFN package 400 may be a QFN package larger than 15 mm×15 mm and may include any number of leads.

Figure 5:
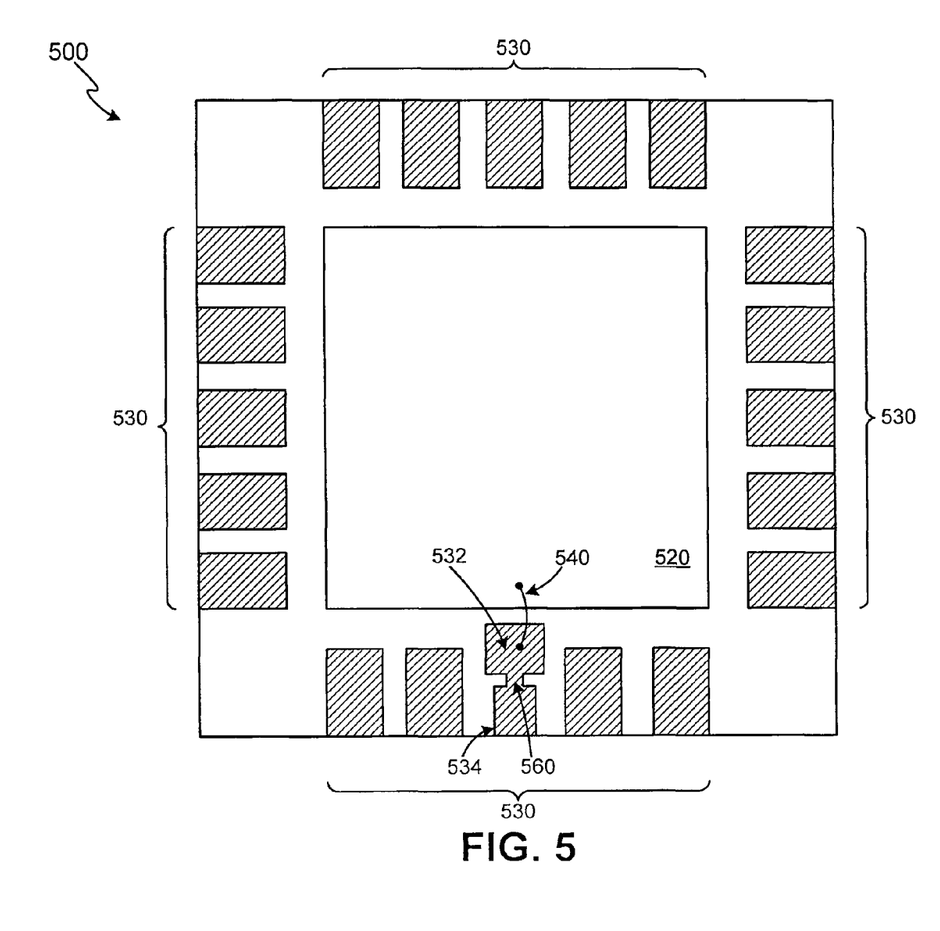
FIG. 5 is a schematic diagram of yet another exemplary embodiment of a high frequency QFN package.

FIG. 5 is a schematic diagram of another exemplary embodiment of a QFN package 500 capable of operating at high frequencies. In one embodiment, QFN package 500 is a QFN package similar to QFN package 100, discussed above. Furthermore, QFN package 500, in various embodiments, includes a MMIC chip 520, a plurality leads 530, and an over-mold material 550 similar to MMIC 120, leads 130, and over-mold material 150, discussed above respectively.

In one embodiment, QFN package 500 also includes a capacitance lead 532 connected to MMIC 520 via a wirebond 540 similar to capacitance lead 132 connected to MMIC 120 via wirebond 140, discussed above. In accordance with various exemplary embodiments of the invention, QFN package 500 includes an I/O lead 534 connected to capacitance lead 532 via a transmission line 560.

Transmission line 560 may be any device suitably configured to facilitate transfer of a signal between capacitance lead 532 and I/O lead 534. As such, transmission line 560 may be any transmission line known in the art or later developed. As such, transmission line 560 may be formed of any conductive material (e.g., copper, gold, aluminum, silver, and the like). In an aspect of various exemplary embodiments of the invention, transmission line 560 may be formed of substantially the same material as capacitance lead 532 and/or I/O lead 534. In other aspects of the invention, transmission line 560 may be formed of a different material than capacitance lead 532 and/or I/O lead 534. Furthermore, transmission line 560 may include any suitable size, shape, height, width, depth, mass, volume, thickness, material, and the like to facilitate transmission of a signal between capacitance lead 532 and I/O lead 534.

Notably, QFN package 500, in various exemplary embodiments, includes any size QFN package known in the art or later developed. Similar to QFN package 100, QFN package 500 may be as small as a 2×2 (i.e., 2 mm×2 mm) QFN package, and as large as a 15×15 (i.e., 15 mm×15 mm) QFN package. In the exemplary embodiment illustrated in FIG. 5, QFN package 500 is a 7×7 (i.e., 7 mm×7 mm), 20-lead QFN package. In addition, the invention does contemplate that QFN package 200 may be a QFN package larger than 15 mm×15 mm and may include any number of leads.

Figure 6:
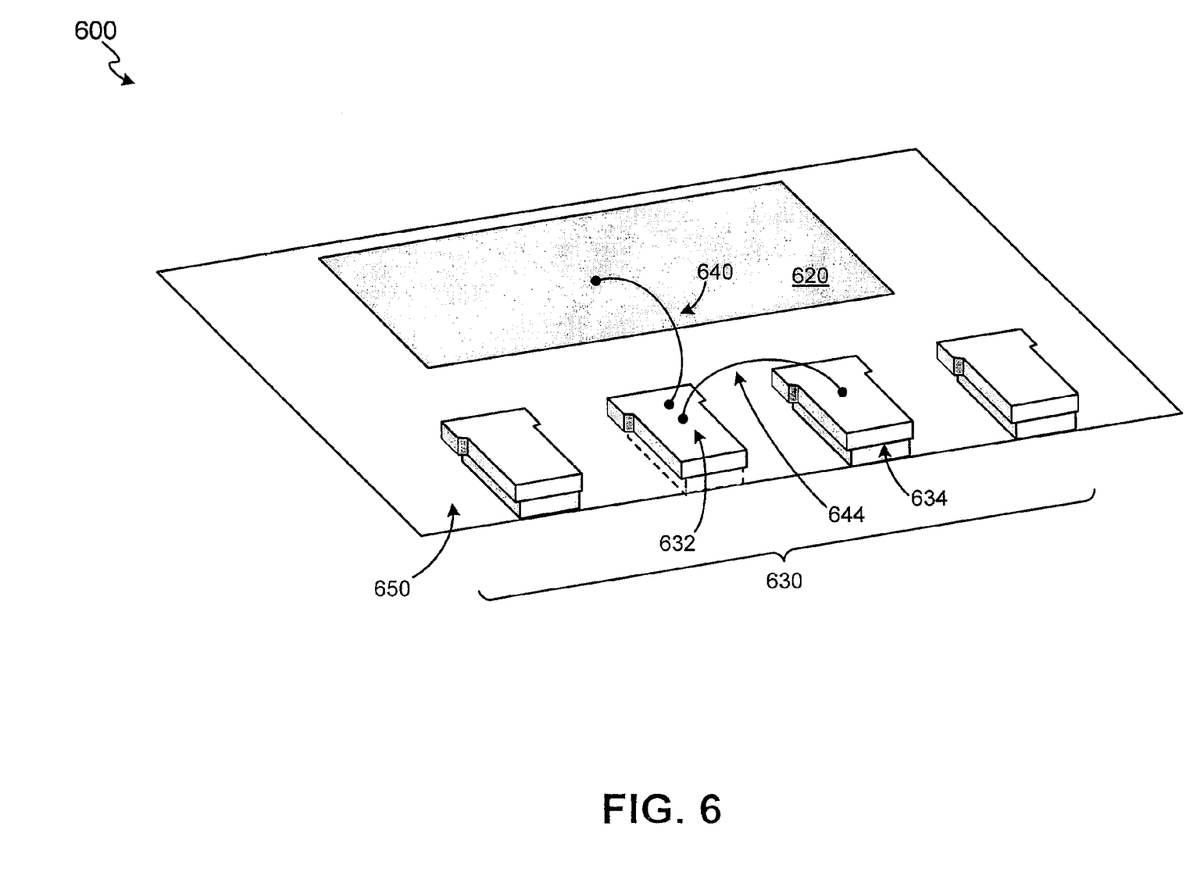
FIG. 6 is a schematic diagram of an exemplary embodiment of a high frequency QFN package including a lead functioning as at least a portion of a capacitor.

FIG. 6 is a schematic diagram of a portion of an exemplary embodiment of a QFN package 600 including a lead functioning as at least a portion of a capacitor. In one embodiment, QFN package 600 is a QFN package similar to QFN package 100, discussed above. Furthermore, QFN package 600, in various embodiments, includes a MMIC chip 620, a plurality leads 630, and an over-mold material 650 similar to MMIC 120, leads 130, and over-mold material 150, discussed above respectively.

In various exemplary embodiments, QFN package 600 also includes a capacitance lead 632 connected to MMIC 620 via a wirebond 640 similar to capacitance lead 132 connected to MMIC 120 via wirebond 140, discussed above. Moreover, QFN package 600 includes an I/O lead 634 connected to capacitance lead 632 via a wirebond 644 similar to I/O lead 134 connected to capacitance lead 132 via a wirebond 144, discussed above.

Capacitance lead 632, in one exemplary embodiment, is configured to include any suitable size, shape, height, width, depth, mass, volume, thickness, material, and the like which may have the effect of reducing and/or decreasing the effect of the inductance created by wirebond 640 and/or wirebond 644. In an aspect of one exemplary embodiment of the invention, capacitance lead 632 may be "floating" within over-mold material 650 such that capacitance lead 632 forms at least a portion of a capacitor (e.g., a capacitor plate, and air, plastic or other dielectric filler).

QFN package 600, in various exemplary embodiments, includes any size QFN package known in the art or later developed. Similar to QFN package 100, QFN package 600 may be as small as a 2×2 (i.e., 2 mm×2 mm) QFN package, and as large as a 15×15 (i.e., 15 mm×15 mm) QFN package. In the exemplary embodiment illustrated in FIG. 6, QFN package 600 is an 8×8 (i.e., 8 mm×8 mm), 16-lead QFN package. In addition, the invention does contemplate that QFN package 200 may be a QFN package larger than 15 mm×15 mm and may include any number of leads.

Notably, the above discussion of packages 100, 200, 300, 400, 500, and 600 discussed these packages in terms of QFN packages, however, the invention contemplates that QFN packages 100, 200, 300, 400, 500, and 600 may be any over-molded leadframe package. As such, the above discussion is also applicable to, but not limited to, SOIC Packages, QSOP, TSSOP, MSOP, DFN Packages, SOT Packages, SC70-6 Packages, SSOP Packages, PDIP Packages, SPDIP Packages, MLFP Packages, PSOP Packages, PLCC Packages, MQFP Packages, TQFP Packages, PQ-LQFP Packages, SIP Packages, BGA Packages (BGA), and any other over-molded leadframe package.

Figure 7A:
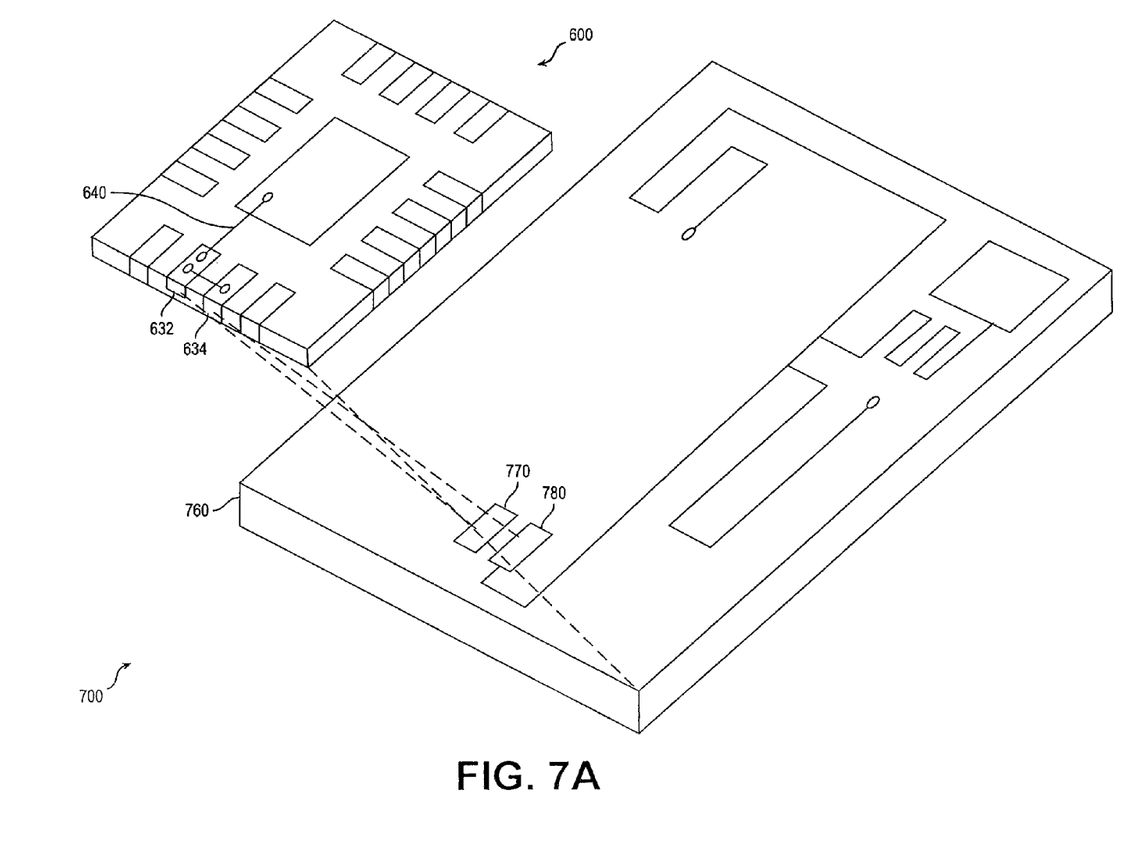
FIGS. 7A and 7B are each perspective views of schematic diagrams of an exemplary system to increase the frequency of operation of the high frequency QFN package of FIG. 6.
Figure 7B:
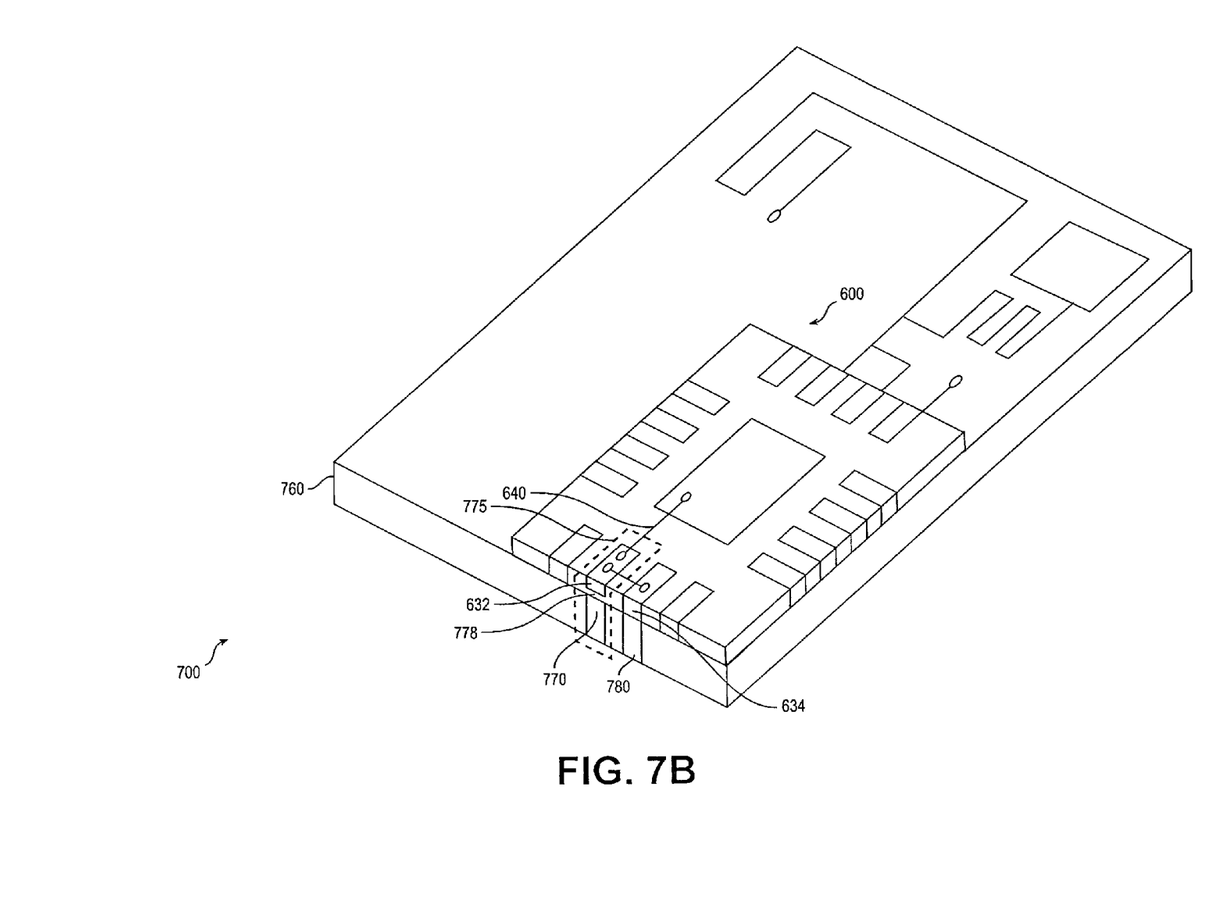

FIGS. 7A and 7B are each a perspective view of schematic diagrams of an exemplary system 700 to increase the frequency of operation of QFN package 600 discussed above.

FIG. 7A illustrates QFN package 600 being connected to a printed circuit board (PCB) 760. PCB 760 may be any PCB component or components known in the art capable of utilizing a QFN package.

In one exemplary embodiment, PCB 760 includes capacitance lead 770, which may be formed of any material known in the art capable of forming at least a portion of a capacitor when suitably configured. PCB 760, in another exemplary embodiment, includes I/O lead 780, which may be formed of any known material and may include any shape known in the art capable of transmitting a signal to and/or from QFN package 600.

FIG. 7B illustrates packages 600 connected to PCB 760 such that a completed capacitor 775 is formed. In one embodiment, capacitor 775 is made up of capacitance lead 632, capacitance lead 770, and space (i.e., air, plastic, or other suitable material) 778. As such, capacitance lead 632 forms at least a portion of capacitor 775, capacitance lead 770 forms at least a second portion of capacitor 775, and space 778 forms the necessary gap needed to form capacitor 775. In exemplary embodiments, capacitor 775 is a capacitor is the range of about 0.001 picofarads (pF) to about 0.2 pF, preferably a capacitor of about 0.02 pF. The invention contemplates, however, that capacitor 775 may be any size capacitor to offset and/or reduce the effect of inductance created by wirebond 640, discussed above.

Furthermore, system 700 includes I/O lead 780 similar to lead 634, discussed above. As such, I/O lead 634 may be formed of any material and include any shape known in the art suitable for transmitting a signal to and/or from QFN package 600. Moreover, I/O lead 780 may include any lead suitable for transferring a signal between QFN package 600 and PCB 760.

In addition, though system 700 has been discussed in terms of QFN package 600, system 700 may include a QFN package configured similar to packages 100, 200, 300, 400, and 500, discussed above. As such, capacitance leads, 132, 232, 332, 432, and 532 may be configured such that space 778 would be formed between capacitance leads, 132, 232, 332, 432, and 532, and capacitance lead 770.

Figure 8:
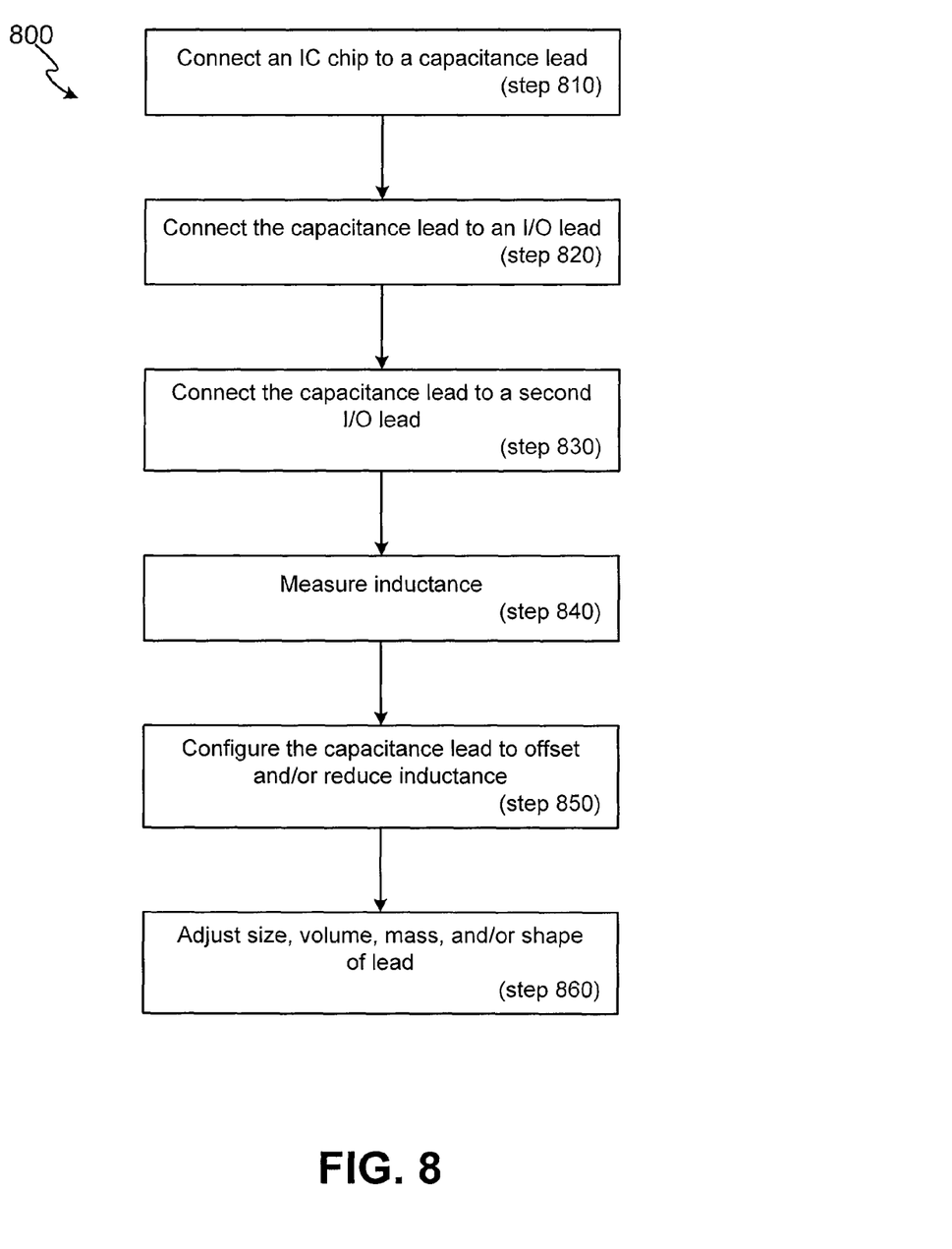
FIG. 8 is a flow diagram of an exemplary method to reduce and/or offset the effect of the inductance of a QFN package.

FIG. 8 is a flow diagram of an exemplary embodiment of a method 800 to reduce and/or offset the effect of the inductance of a QFN package (e.g., QFN packages 100, 200, 300, 400, 500, and 600). In accordance with one exemplary embodiment of the invention, method 800 initiates with connecting an IC chip (e.g., IC chips 120, 220, 320, 420, 520, and 620) to a capacitance lead (e.g., capacitance leads, 132, 232, 332, 432, 532, and 632) via a first wirebond (e.g., wirebonds 140, 240, 340, 440, 540, 640) (step 810). In another exemplary embodiment, the capacitance lead is connected to an I/O lead (e.g., I/O leads, 134, 234, 334, 444, 534, 634) via a second wirebond (e.g., wirebonds 144, 244, 344, 444, and 644) or a transmission line (e.g., transmission line 560) (step 820).

In accordance with various embodiments, the capacitance lead is connected to a second I/O lead (e.g., I/O leads 336 and 438) via a wirebond (e.g., wirebonds 348 and 448) (step 830). In another exemplary embodiment, the inductance created by the first wirebond (i.e., the wirebond connecting the IC chip and the capacitance lead) is measured, estimated, or known (step 840), and the capacitance lead is appropriately configured to substantially reduce and/or substantially offset the effect of the inductance (step 850). In accordance with one aspect of one exemplary embodiment, the size, volume, mass, material, and/or shape of the capacitance lead is adjusted to form a capacitor having any desired capacitance to suitably reduce and/or offset the effect of the inductance created by the first wirebond (step 860).

Benefits, other advantages, and solutions to problems have been described herein with regard to specific embodiments. However, the benefits, advantages, solutions to problems, and any element(s) that may cause any benefit, advantage, or solution to occur or become more pronounced are not to be construed as critical, required, or essential features or elements of any or all the claims or the invention. The scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described exemplary embodiments that are known to those of ordinary skill in the art are expressly incorporated herein by reference and are intended to be encompassed by the present claims.

We claim:

1. An overmolded leadframe package comprising:
a leadframe;
an overmold material surrounding portions of the leadframe and forming a bottom surface of the overmolded leadframe package, wherein the bottom surface is configured to be connected to a printed circuit board (PCB);
an integrated circuit electrically connected to the leadframe and contained within the overmolded leadframe package; and
a capacitance lead in the overmolded leadframe package, wherein the capacitance lead is located in the overmolded leadframe package so that it can not contact the PCB, and wherein the capacitance lead is configured to form a first portion of a capacitor in response to alignment with a corresponding capacitance lead on the PCB.

2. The overmolded leadframe package of claim 1, further comprising:
a first wirebond connected to the capacitance lead on a first end of the first wirebond and to the integrated circuit on a second end of the first wirebond;
a first input/output lead in the overmolded leadframe package, wherein the first input/output lead is located in the overmolded leadframe package so that it can contact the PCB; and
a second wirebond connecting the first input/output lead to the capacitance lead.

3. The overmolded leadframe package of claim 2, wherein the capacitance lead is configured to reduce and offset an amount of inductance created by the first wirebond.

4. The overmolded leadframe package of claim 1, wherein a dielectric space is formed, between the capacitance lead and the corresponding capacitance lead on the PCB, when the overmolded leadframe package is connected to the PCB.

5. The overmolded leadframe package of claim 1, wherein the capacitance lead is a low pass filter.

6. The overmolded leadframe package of claim 2, wherein the first wirebond coupled to the capacitance lead, and the second wirebond coupled to the capacitance lead comprises an inductor-capacitor-inductor topology.

7. The overmolded leadframe package of claim 2, further comprising a third wirebond coupling the capacitance lead to a second input/output lead.

8. The overmolded leadframe package of claim 1, wherein the overmolded leadframe package is configured to operate in the range of about 5 GHz to about 300 GHz.

9. The overmolded leadframe package of claim 1, wherein the integrated circuit is a monolithic microwave integrated circuit (MMIC).

10. An overmolded leadframe package comprising:
a capacitance lead configured to form a part of a capacitor in the overmolded leadframe package; and
at least one wirebond attached to the capacitance lead and attached to an integrated circuit, wherein the integrated circuit is located within the overmolded leadframe package;
wherein the capacitance lead is configured to align with a corresponding capacitance lead in a printed circuit board (PCB) and is further configured to reduce or offset the inductance of the at least one wirebond.

11. The overmolded leadframe package of claim 10, wherein the capacitance lead is isolated from direct physical contact with the PCB.

12. The overmolded leadframe package of claim 11, further comprising an input/output lead configured to directly connect to the PCB for communication of radio frequency signals with the PCB.

13. The overmolded leadframe package of claim 10, wherein the capacitance lead floats within the overmolded leadframe package.

14. The overmolded leadframe package of claim 10, further comprising a dielectric space formed between the capacitance lead and the corresponding capacitance lead of the PCB.

15. The overmolded leadframe package of claim 10, wherein the capacitance lead comprises a first plate of a capacitor, and wherein a second plate of the capacitor is not on the overmolded leadframe package.

16. The overmolded leadframe package of claim 15, wherein the capacitor is only formed when the overmolded leadframe package is placed in proximity with the second plate and placed such that the second plate is in alignment with the first plate with a space between the first and second plates.

17. The overmolded leadframe package of claim 16, wherein the space between the first and second plates comprises a dielectric material.

18. An overmolded leadframe package comprising:
an input/output lead; and
a capacitance lead wirebonded to the input/output lead;
wherein the capacitance lead can not make a physical contact with anything outside of the overmolded leadframe package.

19. A overmolded leadframe package comprising at least one raised lead, wherein the at least one raised lead is a first plate of a two plate capacitor that is formed only by mounting the overmolded leadframe package to a printed circuit board that comprises a second plate of the two plate capacitor.

20. A method of making an electronic device that comprises a package that comprises an integrated circuit chip, a first lead, and a second lead, the method comprising:
coupling a first wirebond to the integrated circuit chip and the first lead;
coupling a second wirebond to the first lead and the second lead, wherein the first lead is a capacitance lead comprising one plate of a two plate capacitor, wherein the first lead is configured to not contact a printed circuit board (PCB), wherein the second lead is a radio frequency input/output lead having a surface that is flush with a surface of the package, wherein the second lead is configured to contact the PCB, wherein the PCB further comprises a metal region; and
substantially aligning the metal region on the PCB with the first lead such that the metal region of the PCB forms the second plate of the two plate capacitor.

21. The method of claim 20, further comprising coupling a third wirebond to the first lead and a third lead, wherein the second and third leads are radio frequency input/output leads.

22. The method of claim 20, further comprising:
estimating an inductance created by the first wirebond; and
configuring the first lead to at least one of offset and reduce the effect of the inductance.

23. The method of claim 22, wherein the configuring the first lead comprises adjusting at least one of a size, a volume, a mass, a shape, and configuration of the first lead to form a capacitor having a pre-determined capacitance.

24. An overmolded leadframe package comprising:
a leadframe;
an overmold material surrounding portions of the leadframe and forming a bottom surface of the overmolded leadframe package, wherein the bottom surface connects to a printed circuit board (PCB);
an integrated circuit electrically connected to the leadframe and contained within the overmolded leadframe package;
a capacitance lead in the overmolded leadframe package, wherein the capacitance lead is located in the overmolded leadframe package so that it can not contact the PCB, and wherein the capacitance lead forms a first portion of a capacitor in response to alignment with a corresponding capacitance lead on the PCB; and
a dielectric space formed between the capacitance lead and the corresponding capacitance lead on the PCB.

* * * * *